United States Patent
Park et al.

(10) Patent No.: US 10,224,235 B2
(45) Date of Patent: Mar. 5, 2019

(54) SYSTEMS AND METHODS FOR CREATING AIRGAP SEALS USING ATOMIC LAYER DEPOSITION AND HIGH DENSITY PLASMA CHEMICAL VAPOR DEPOSITION

(71) Applicant: Lam Research Corporation, Fremont, CA (US)

(72) Inventors: Jason Daejin Park, Lake Oswego, OR (US); Bart van Schravendijk, Sunnyvale, CA (US); Hsiang-yun Lee, Cupertino, CA (US); Purushottam Kumar, Hillsboro, OR (US)

(73) Assignee: LAM RESEARCH CORPORATION, Fremont, CA (US)

(*) Notice: Subject to any disclaimer, the term of this patent is extended or adjusted under 35 U.S.C. 154(b) by 0 days.

(21) Appl. No.: 15/422,953

(22) Filed: Feb. 2, 2017

(65) Prior Publication Data

US 2017/0229337 A1    Aug. 10, 2017

Related U.S. Application Data

(60) Provisional application No. 62/291,771, filed on Feb. 5, 2016.

(51) Int. Cl.
| | |
|---|---|
| *H01L 21/00* | (2006.01) |
| *H01L 21/768* | (2006.01) |
| *H01L 21/02* | (2006.01) |
| *H01L 23/485* | (2006.01) |

(52) U.S. Cl.
CPC ...... *H01L 21/7682* (2013.01); *H01L 21/0228* (2013.01); *H01L 21/02164* (2013.01); *H01L 21/02211* (2013.01); *H01L 21/02266* (2013.01); *H01L 21/02274* (2013.01); *H01L 21/02315* (2013.01); *H01L 23/485* (2013.01)

(58) Field of Classification Search
CPC ........... H01L 21/7682; H01L 21/02164; H01L 21/02211; H01L 21/02266; H01L 21/02274; H01L 21/0228; H01L 21/02315
See application file for complete search history.

(56) References Cited

U.S. PATENT DOCUMENTS

| | | | | |
|---|---|---|---|---|
| 5,468,987 A | * | 11/1995 | Yamazaki | ......... H01L 21/76897 257/308 |
| 6,376,330 B1 | * | 4/2002 | Fulford, Jr. | ......... H01L 21/7682 257/E21.581 |
| 8,592,328 B2 | | 11/2013 | Hausmann et al. | |
| 8,728,955 B2 | | 5/2014 | LaVoie et al. | |

* cited by examiner

Primary Examiner — Richard A Booth

(57) ABSTRACT

A method for processing a substrate to create an air gap includes a) providing a substrate including a first trench and a second trench; b) depositing a conformal layer on the substrate; c) performing sputtering to at least partially pinch off an upper portion of the first trench and the second trench at a location spaced from upper openings of the first trench and the second trench; and d) performing sputtering/deposition to seal first and second airgaps in the first trench and the second trench.

21 Claims, 5 Drawing Sheets

SYSTEMS AND METHODS FOR CREATING AIRGAP SEALS USING ATOMIC LAYER DEPOSITION AND HIGH DENSITY PLASMA CHEMICAL VAPOR DEPOSITION

CROSS-REFERENCE TO RELATED APPLICATIONS

This application claims the benefit of U.S. Provisional Application No. 62/291,771, filed on Feb. 5, 2016. The entire disclosure of the application referenced above is incorporated herein by reference.

FIELD

The present disclosure relates to substrate processing systems, and more particularly to systems and methods for creating airgap seals using atomic layer deposition (ALD) and high density plasma (HDP) chemical vapor deposition (CVD).

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to deposit and etch film on a substrate such as a semiconductor wafer. The substrate processing systems typically include a processing chamber, a gas distribution device and a substrate support. During processing, the substrate is arranged on the substrate support. Different gas mixtures may be introduced into the processing chamber and radio frequency (RF) plasma may be used to activate chemical reactions.

As gate pitch decreases, parasitic capacitance between gates of transistors has increasingly become important. Parasitic capacitance adversely impacts power consumption and switching speed. Efforts have been made to reduce a dielectric constant (k) of the gate stack. Spacer film located between gates and a source/drain contact may also impact the effective k value of the gate stack. Current suggestions for reducing the effective k value of the gate stack include lowering the k value of film used for the gates or spacers or forming airgaps in the spacer film.

Forming an airgap in the spacer film has been used due to the low dielectric constant k value of air. Challenges include creating, burying and sealing the airgap sufficiently low in the feature such that the airgap remains sealed and protected during subsequent chemical mechanical polishing (CMP). In addition, a sufficient over-etch margin should be provided. Conventional chemical vapor deposition (CVD) processes may be used to create airgaps. However, the airgaps created by CVD processes are not buried low enough inside features such as trenches and damage may occur during subsequent processing.

Referring now to FIGS. 1-3, an example of a method for creating airgaps in spacers is shown. In FIG. 1, a substrate 50 includes an underlying layer 52 and metal gates 54-1 and 54-2 and source/drain contact 56 that are arranged on the underlying layer 52. Self-aligning contact (SAC)'s 58-1 and 58-2 are arranged on the metal gates 54-1 and 54-2, respectively. Spacers 60-1, 60-2, 60-3 and 60-4 (collectively spacers 60) are arranged between the metal gates 54-1 and 54-2 and the source/drain contact 56. The spacers 60 may be made of silicon nitride (SiN), silicon dioxide ($SiO_2$), or another type of film.

In FIG. 2, selective etching is performed to remove the spacers 60. In FIG. 3, spacers 70-1, 70-2, 70-3 and 70-4 (collectively spacers 70) are deposited and include airgaps 72-1, 72-2, 72-3 and 72-4 (collectively airgaps 72). However, the airgaps 72 are typically located relatively close to an upper surface of the spacers 70. As a result, defects can occur if the airgap is exposed during chemical mechanical polishing (CMP). In addition, an increased over-etch margin is desired.

SUMMARY

A method for processing a substrate to create an air gap includes a) providing a substrate including a first trench and a second trench; b) depositing a conformal layer on the substrate; c) performing sputtering and re-deposition to at least partially pinch off an upper portion of the first trench and the second trench at a location spaced from upper openings of the first trench and the second trench; and d) performing sputtering/deposition to seal first and second airgaps in the first trench and the second trench.

In other features, c) is performed using first high density plasma (HDP) chemical vapor deposition (CVD) process without film precursor.

In other features, d) is performed using second high density plasma (HDP) chemical vapor deposition (CVD) process with film precursor.

In other features, the substrate includes a first metal gate arranged on an underlying layer, a second metal gate arranged on the underlying layer, and a contact arranged between the first metal gate and the second metal gate. The first trench is located between the first metal gate and the contact. The second trench is located between the second metal gate and the contact.

In other features, a first self-aligning contact layer is arranged on the first metal gate and a second self-aligning contact is arranged on the second metal gate. The method includes depositing the conformal layer using atomic layer deposition.

In other features, the first trench and the second trench have a first aspect ratio. The first trench and the second trench have a second aspect ratio after the conformal layer is deposited. The second aspect ratio is greater than the first aspect ratio.

A method for processing a substrate to create an air gap includes a) providing a substrate including features having a first aspect ratio; b) depositing a conformal layer on the substrate. The features have a second aspect ratio after the conformal layer is deposited. The second aspect ratio is greater than the first aspect ratio. The method includes c) performing sputtering and re-deposition using a first high density plasma (HDP) chemical vapor deposition (CVD) process without film precursor to at least partially pinch off an upper portion of the features at a location spaced from upper openings of the features; and d) performing sputtering/deposition using a second HDP CVD process with film precursor to seal first and second airgaps in the features.

In other features, the substrate includes a first metal gate arranged on an underlying layer; a second metal gate arranged on the underlying layer; and a contact arranged between the first metal gate and the second metal gate. The features include a first trench located between the first metal gate and the contact and a second trench located between the second metal gate and the contact. A first self-aligning contact layer is arranged on the first metal gate. A second self-aligning contact is arranged on the second metal gate.

In other features, the method includes depositing the conformal layer using atomic layer deposition.

A method for processing a substrate to create an air gap includes a) providing a substrate including a first metal gate arranged on an underlying layer, a second metal gate arranged on the underlying layer, a contact arranged between the first metal gate and the second metal gate, a first trench is located between the first metal gate and the contact, a second trench is located between the second metal gate and the contact, a first self-aligning contact layer arranged on the first metal gate, and a second self-aligning contact arranged on the second metal gate. The method further includes b) depositing a conformal layer on the substrate; c) performing sputtering and re-deposition using a first high density plasma (HDP) chemical vapor deposition (CVD) process to at least partially pinch off an upper portion of the first trench and the second trench at a location spaced from upper openings of the first trench and the second trench; and d) performing sputtering/deposition using a second HDP CVD process to seal first and second airgaps in the first trench and the second trench.

In other features, the method includes depositing the conformal layer using atomic layer deposition. The first trench and the second trench have a first aspect ratio. The first trench and the second trench have a second aspect ratio after the conformal layer is deposited. The second aspect ratio is greater than the first aspect ratio.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Systems and methods according to the present disclosure can be used to create airgaps in spacer film using atomic layer deposition (ALD) and high density plasma (HDP) chemical vapor deposition (CVD). More particularly, the airgaps are created at a location that is relatively low in a feature such that a sufficient over-etch margin is created and the likelihood of damage during subsequent processing is substantially reduced.

Figure 1:
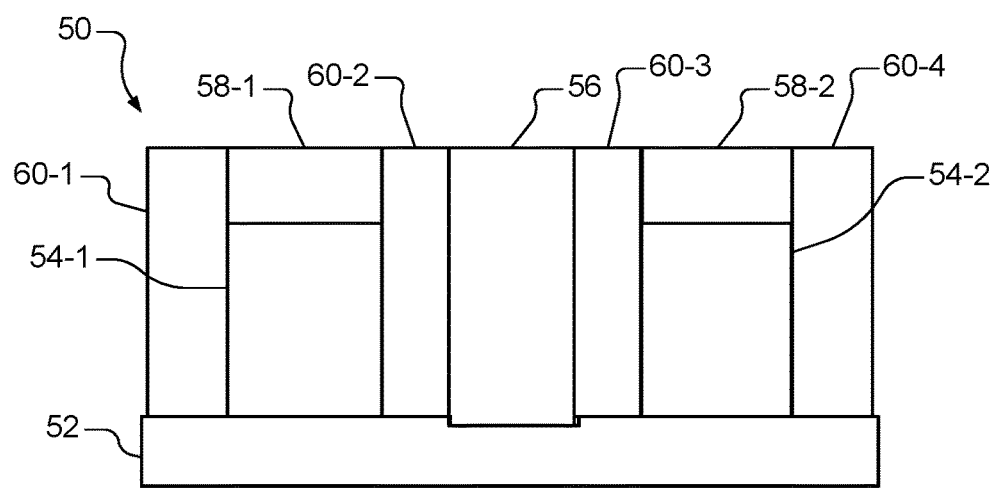
FIG. 1 is a side cross-sectional view of a substrate including metal gates, a source/drain contact and spacers according to the prior art.
Figure 2:
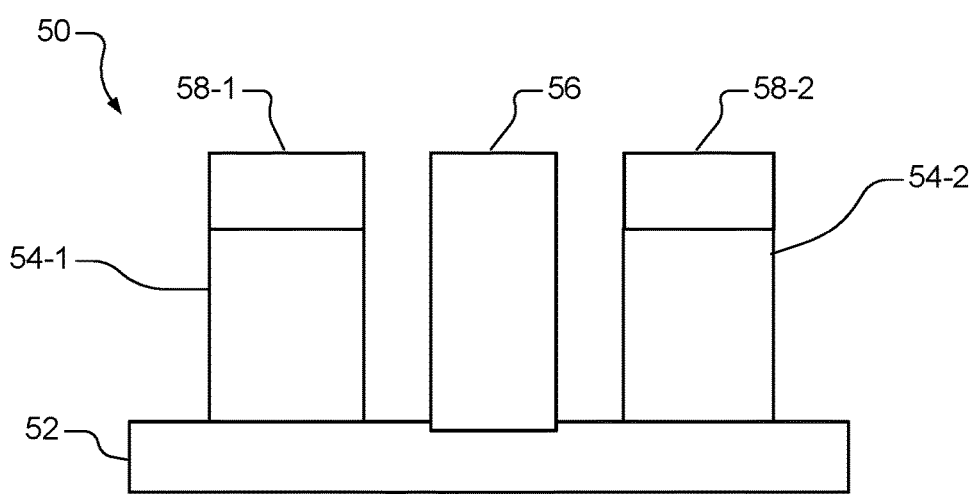
FIG. 2 is a side cross-sectional view of the substrate of FIG. 1 after the spacers are etched according to the prior art.
Figure 3:
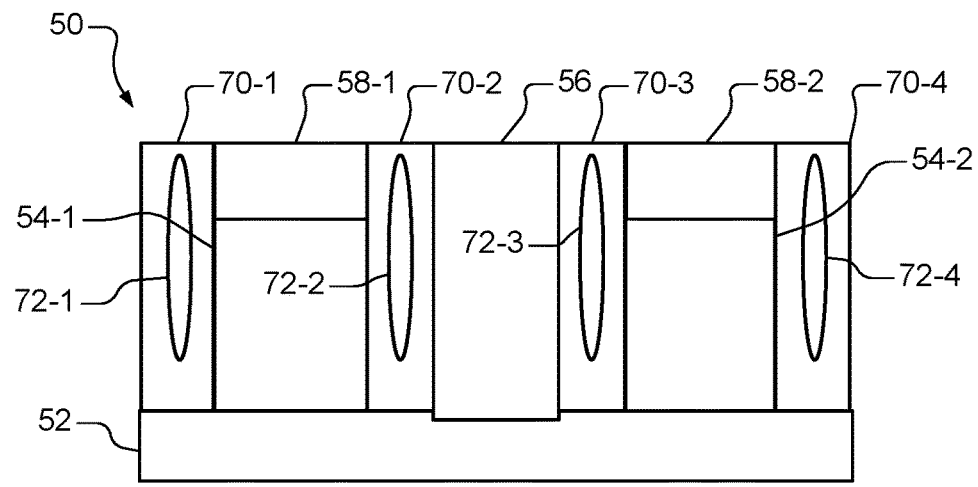
FIG. 3 is a side cross-sectional view of the substrate of FIG. 2 after spacers including airgaps are deposited according to the prior art.
Figure 4:
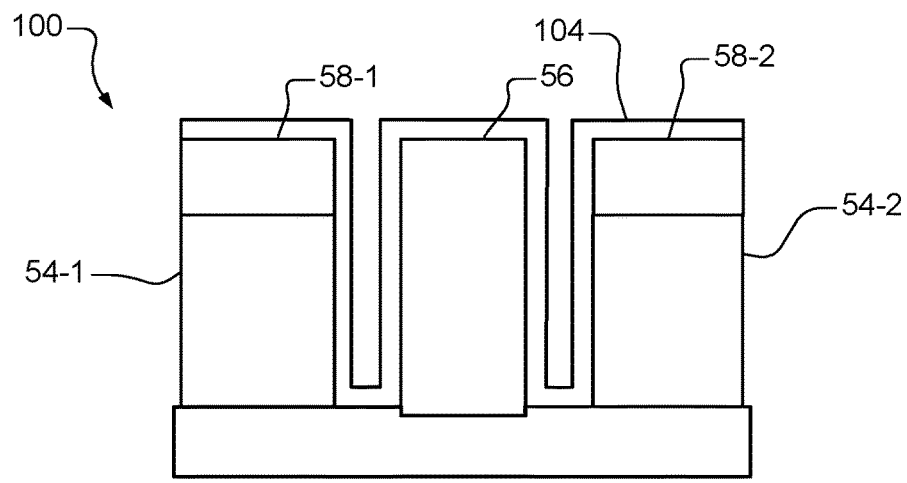
FIG. 4 is a side cross-sectional view of the substrate of FIG. 2 after a conformal layer is deposited to increase the aspect ratio of a feature according to the present disclosure.

Referring now to FIG. 4, a substrate 100 according to the present disclosure is shown and includes a conformal layer 104 that is deposited on the substrate of FIG. 2. The conformal layer 104 increases the aspect ratio (AR) of a feature such as a trench. The conformal layer 104 also provides protection to the underlying layers during sputtering in subsequent processing steps described below.

Figure 5:
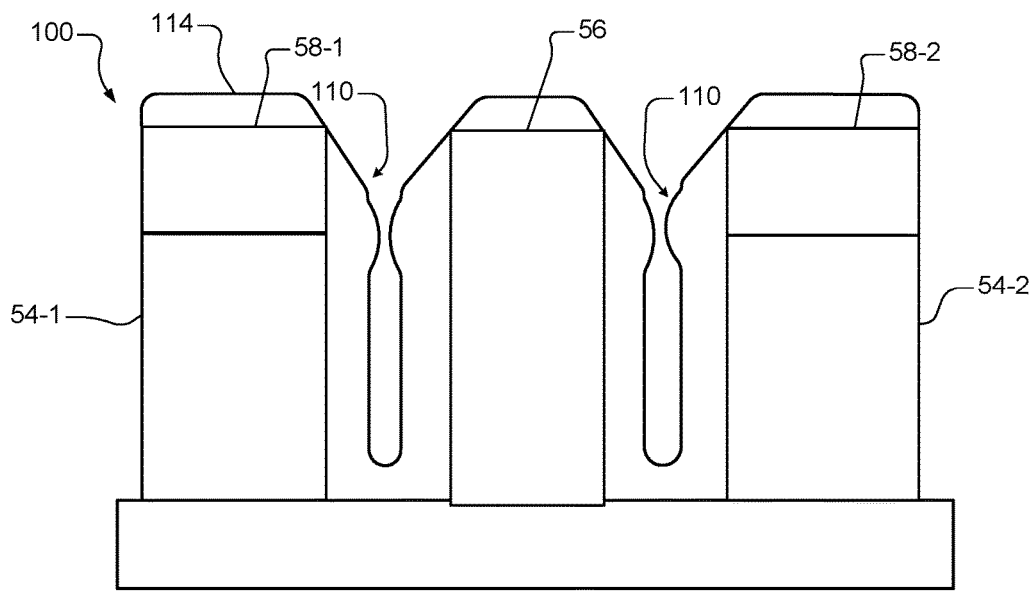
FIG. 5 is a side cross-sectional view of the substrate of FIG. 4 after pre-sputtering/deposition using HDP CVD to create a cusp according to the present disclosure.

Referring now to FIG. 5, pre-sputtering using HDP CVD without film precursor is performed to create cusps 110 or raised portions that pinch off a portion of the feature. As can be appreciated, the pre-sputtering sputters and re-deposits material from an upper location of the conformal layer to a lower location inside the feature. In other words, the cusps 110 are created at a location spaced below a field of the SACs 58-1 and 58-2. Furthermore, the cusps 110 are located on opposite surfaces of the features to create a pinch point that can be filled during a subsequent deposition step. In some examples, the pre-sputtering is performed in a HDP CVD processing chamber such as the substrate processing chamber described below in conjunction with FIG. 8.

Figure 6:
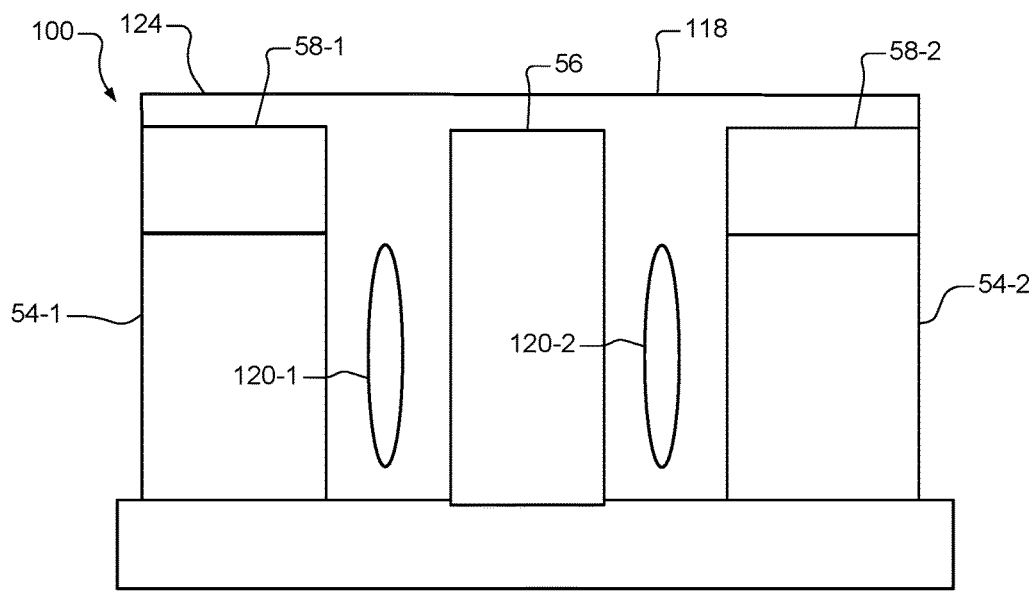
FIG. 6 is a side cross-sectional view of the substrate of FIG. 5 after sputtering/deposition by HDP CVD to seal the airgap.

Referring now to FIG. 6, sputtering/deposition by HDP CVD with film precursor is performed to close off and seal airgaps 120-1 and 120-2 inside spacer film 122 between the metal gates 54-1 and 54-2 and the source/drain contact 56. As can be appreciated, the location of the airgaps 120-1 and 120-2 inside spacer film 122 is significantly lower than the location of airgaps that would otherwise be formed using other approaches. In some examples, the HDP CVD deposition is performed in a HDP CVD processing chamber such as the substrate processing chamber described below in conjunction with FIG. 8.

Figure 7:
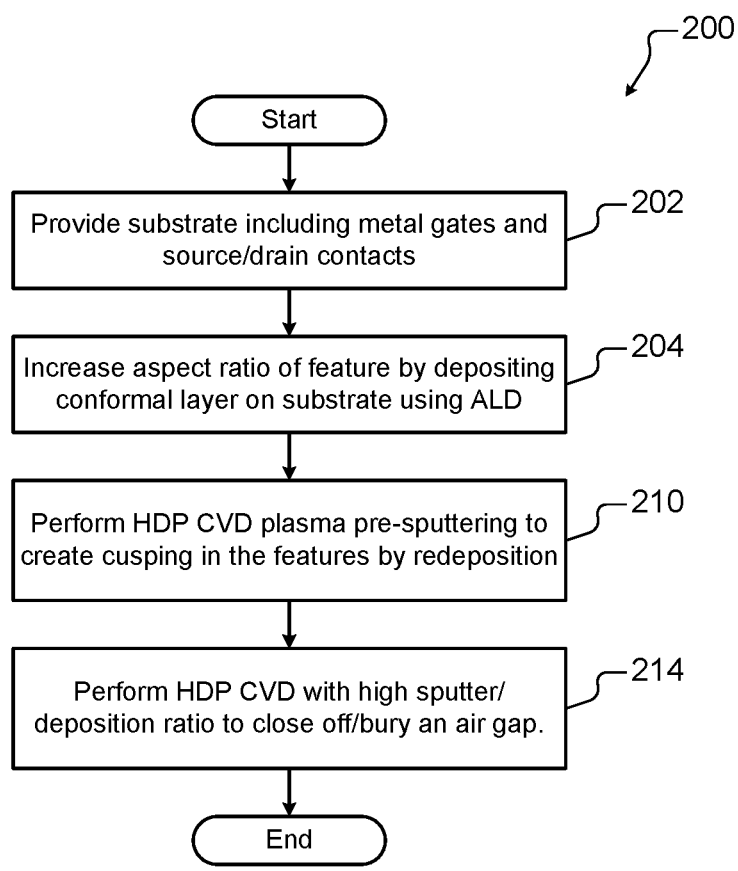
FIG. 7 is a flowchart illustrating an example of a method for creating airgaps in spacers of a substrate.

Referring now to FIG. 7, a method 200 for creating airgaps in spacer film of a substrate is shown. At 202, a substrate is provided. In some examples, the substrate includes metal gates, one or more source/drain contacts that are spaced between the metal gates, and SAC caps arranged on the metal gates. At 204, an aspect ratio of the feature of the substrate is increased by depositing a conformal layer on the substrate using ALD. The conformal layer 104 also provides protection to the underlying layers during sputtering in subsequent processing steps described below. At 210, pre-sputtering is performed using HDP CVD plasma to create cusping by sputtering and re-deposition at a location that is lower in the feature. At 214, HDP CVD is performed with a high sputtering/deposition ratio to close off or bury the airgap in the spacer between the metal gates.

Figure 8:
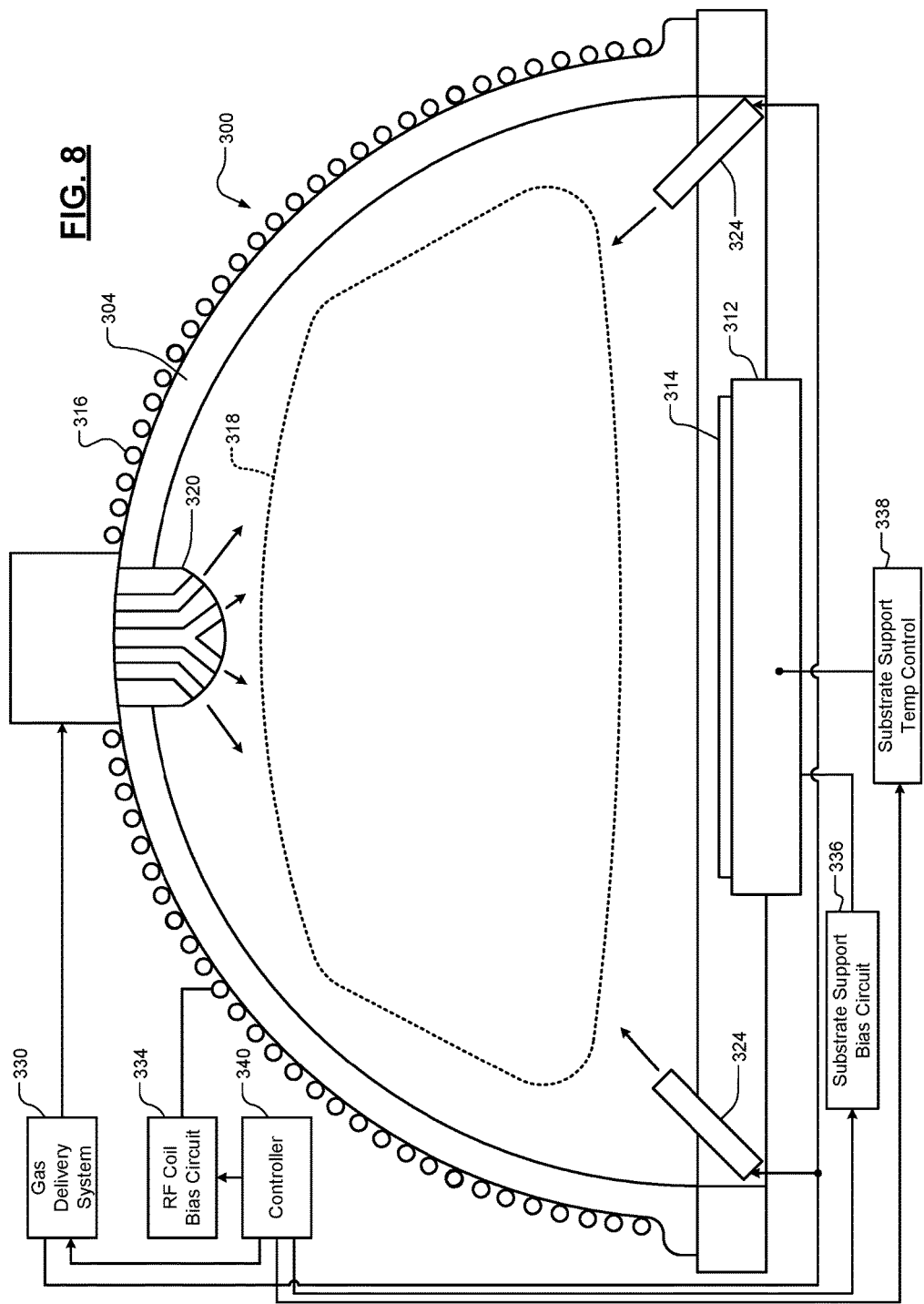
FIG. 8 is a functional block diagram of an example of a substrate processing chamber for performing pre-sputtering and deposition in FIGS. 5 and 6 according to the present disclosure.

Referring now to FIG. 8, an example of a substrate processing chamber 300 that may be used for pre-sputtering and deposition steps described above. The substrate processing chamber 300 includes a semi-spherical dome 304 and a substrate support 312 for supporting a substrate 314. While a semi-spherical dome is shown, the processing chamber may have other shapes such as elliptical, flat-topped, etc. In some examples, the substrate includes an electrostatic chuck (ESC) although other substrate supports may be used. A coil 316 is arranged around an outer surface of the semi-spherical dome 304. One or more upper gas injectors 320 inject a process gas mixture in a downward and/or outward direction into an upper portion of the semi-spherical dome 304. One or more lower gas injectors 324 are arranged in a lower portion of the semi-spherical dome 304 to inject the process gas mixture in an upward and inward direction relative to the semi-spherical dome 304 and the substrate 312. For example only, the lower gas injectors 324 may include 36 gas injectors that are uniformly spaced around a lower periphery of the semi-spherical dome 304.

A gas delivery system 330 supplies a process gas mixture to the upper gas injectors 320 and the lower gas injectors 324. The gas delivery system 330 may include one or more gas sources, mass flow controllers, valves and manifolds. An RF coil bias circuit 334 supplies RF power to the inductive coil 316 to create plasma 318 within the semi-spherical dome 304. A substrate support bias circuit 336 supplies RF power to the substrate support 312. A substrate support temperature control circuit 338 controls a temperature of the substrate support 312 during substrate processing. The substrate temperature control circuit 338 may include systems for delivering heating and/or cooling fluid to flow channels in the substrate support 312, resistive heaters, and/or other devices for controlling the temperature of the substrate support 312.

EXAMPLE

While a specific example of a conformal deposition process is described below, other conformal deposition processes may be used. In some examples, the conformal layer is made of $SiO_2$ film deposited using ALD to a thickness of 40 Angstroms, although other thicknesses may be used. In some examples, the ALD process is performed at a deposition temperature of approximately 400° C. In some examples, multiple ALD cycles are performed. Each ALD cycle includes a dose stage, a purge stage, a plasma conversion stage and an RF purge stage. During the dose stage, a silicon dioxide precursor gas such as 2NTE is supplied to the process chamber to expose the substrate. Carrier gas is supplied at 9 standard liters per minute (slm) for a period of 0.3 s. During the purge stage, molecular nitrogen ($N_2$) gas is supplied for a period of 0.3 s. During the plasma conversion stage, oxidizer gas such as a mixture of molecular oxygen ($O_2$) and nitrous oxide ($N_2O$) are supplied at 10 slm and plasma is struck for a period of 0.3 s and then extinguished. During the RF purge stage, molecular nitrogen gas is supplied for a period of 0.09 s.

While a specific example of a pre-sputtering process is described below, other pre-sputtering processes may be used. In some examples, the substrate processing chamber 300 described above is used. Helium gas us supplied at 1000 sccm and plasma is struck. The pedestal is arranged about 2.5" below an injection location of the lower gas injectors 324 (which roughly corresponds to a lower location of the plasma). About 30% of the process gas mixture is supplied from the upper gas injectors 320 and the remaining gas is supplied by the lower gas injectors 324. The inductive coil 316 is excited by low frequency (LF) and medium frequency (MF) power. In some examples, the LF power has a frequency in a range from 340 to 375 KHz, the MF power has a frequency from 420 to 460 KHz. In some examples, the LF power is 6000 W and the MF power is 3000 W. The substrate support is excited by HF power. In some examples, the HF power has a frequency of 13.56 MHz. In some examples, the HF power is supplied at 1000 W, although other power levels can be used.

While a specific example of a deposition process is described below, other deposition processes may be used. In some examples, a gas mixture including silane ($SiH_4$), molecular hydrogen ($H_2$), helium (He), argon (Ar) and molecular oxygen ($O_2$) is supplied to the processing chamber. In some examples, $SiH_4$ is supplied at 30 sccm, $H_2$ is supplied at 275 sccm, He is supplied at 500 sccm, Ar is supplied at 200 sccm and $O_2$ is supplied at 45 sccm. The pedestal is arranged about 2.5" from an injection location of the lower gas injectors 324 (which roughly corresponds to a lower location of the plasma). About 18% of the process gas mixture is supplied from the upper gas injectors 320 and the remaining gas is supplied by the lower gas injectors 324. The inductive coil is excited by RF power at low frequency (LF) and medium frequency (MF). The pedestal is biased by RF power at high frequency (HF). In some examples, the LF power is 3200 W, the MF power is 1050 W and the HF power is 2500 W, although other power levels can be used.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method for processing a substrate to create an air gap, comprising:
    a) providing a substrate including a first trench and a second trench;
    b) depositing a conformal layer on the substrate;
    c) performing sputtering and re-deposition to at least partially pinch off an upper portion of the first trench and the second trench at a location spaced from upper openings of the first trench and the second trench, wherein c) is performed using a first high density plasma (HDP) chemical vapor deposition (CVD) process using a plasma gas without film precursor; and
    d) performing sputtering/deposition to seal first and second airgaps in the first trench and the second trench.

2. The method of claim 1, wherein the plasma gas includes helium (He).

3. The method of claim 1, wherein d) is performed using a second high density plasma (HDP) chemical vapor deposition (CVD) process.

4. The method of claim 3, wherein the second HDP CVD process uses a plasma gas including a film precursor.

5. The method of claim 3, wherein the second HDP CVD process uses a plasma gas mixture including silane (SiH4), molecular hydrogen (H2), helium (He), argon (Ar) and molecular oxygen (O2).

6. The method of claim 1, wherein the substrate includes:
    a first metal gate arranged on an underlying layer;
    a second metal gate arranged on the underlying layer; and
    a contact arranged between the first metal gate and the second metal gate,
    wherein the first trench is located between the first metal gate and the contact, and wherein the second trench is located between the second metal gate and the contact.

7. The method of claim 6, further comprising:
    a first self-aligning contact layer arranged on the first metal gate; and
    a second self-aligning contact arranged on the second metal gate.

8. The method of claim 1, further comprising depositing the conformal layer using atomic layer deposition.

9. The method of claim 1, wherein:
    the first trench and the second trench have a first aspect ratio;
    the first trench and the second trench have a second aspect ratio after the conformal layer is deposited; and
    the second aspect ratio is greater than the first aspect ratio.

10. A method for processing a substrate to create an air gap, comprising:
    a) providing a substrate including features having a first aspect ratio;
    b) depositing a conformal layer on the substrate, wherein the features have a second aspect ratio after the conformal layer is deposited, and wherein the second aspect ratio is greater than the first aspect ratio;

c) performing sputtering and re-deposition using a first high density plasma (HDP) chemical vapor deposition (CVD) process without film precursor to at least partially pinch off an upper portion of the features at a location spaced from upper openings of the features; and d) performing sputtering/deposition using a second HDP CVD process with film precursor to seal an airgap in the features.

11. The method of claim 10, wherein the first HDP CVD process including a plasma gas mixture including helium (He).

12. The method of claim 10, wherein the second HDP CVD process uses a plasma gas mixture including silane (SiH4), molecular hydrogen (H2), helium (He), argon (Ar) and molecular oxygen (O2).

13. The method of claim 10, wherein the substrate includes:

a first metal gate arranged on an underlying layer;

a second metal gate arranged on the underlying layer; and a contact arranged between the first metal gate and the second metal gate, wherein the features include a first trench located between the first metal gate and the contact and a second trench is located between the second metal gate and the contact.

14. The method of claim 13, further comprising:

a first self-aligning contact layer arranged on the first metal gate; and a second self-aligning contact arranged on the second metal gate.

15. The method of claim 10, further comprising depositing the conformal layer using atomic layer deposition.

16. A method for processing a substrate to create an air gap, comprising:

a) providing a substrate including a first metal gate arranged on an underlying layer, a second metal gate arranged on the underlying layer, a contact arranged between the first metal gate and the second metal gate, a first trench is located between the first metal gate and the contact, a second trench is located between the second metal gate and the contact, a first self-aligning contact layer arranged on the first metal gate, and a second self-aligning contact arranged on the second metal gate;

b) depositing a conformal layer on the substrate;

c) performing sputtering and re-deposition using a first high density plasma (HDP) chemical vapor deposition (CVD) process to at least partially pinch off an upper portion of the first trench and the second trench at a location spaced from upper openings of the first trench and the second trench; and d) performing sputtering/deposition using a second HDP CVD process to seal first and second airgaps in the first trench and the second trench.

17. The method of claim 16, wherein the first HDP CVD process using a plasma gas including helium (He) without a film precursor.

18. The method of claim 16, wherein the second HDP CVD process uses a plasma gas including a film precursor.

19. The method of claim 16, wherein the second HDP CVD process uses a plasma gas mixture including silane (SiH4), molecular hydrogen (H2), helium (He), argon (Ar) and molecular oxygen (O2).

20. The method of claim 16, further comprising depositing the conformal layer using atomic layer deposition.

21. The method of claim 16, wherein:

the first trench and the second trench have a first aspect ratio;

the first trench and the second trench have a second aspect ratio after the conformal layer is deposited; and the second aspect ratio is greater than the first aspect ratio.

* * * * *